(12) United States Patent
Wang et al.

(10) Patent No.: US 8,787,066 B2
(45) Date of Patent: Jul. 22, 2014

(54) METHOD FOR FORMING RESISTIVE SWITCHING MEMORY ELEMENTS WITH IMPROVED SWITCHING BEHAVIOR

(75) Inventors: Yun Wang, San Jose, CA (US); Tony Chiang, Campbell, CA (US); Imran Hashim, Saratoga, CA (US); Vidyut Gopal, Sunnyvale, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 281 days.

(21) Appl. No.: 13/281,777

(22) Filed: Oct. 26, 2011

(65) Prior Publication Data

US 2013/0107604 A1    May 2, 2013

(51) Int. Cl.
*G11C 11/00* (2006.01)
(52) U.S. Cl.
USPC .................. 365/148; 365/163; 365/100
(58) Field of Classification Search
CPC .......... G11C 2213/56; G11C 13/0002; G11C 13/0004
USPC .......................... 365/148, 163, 100
See application file for complete search history.

(56) References Cited

U.S. PATENT DOCUMENTS

| | | | |
|---|---|---|---|
| 6,759,249 B2 | 7/2004 | Zhuang | |
| 7,084,078 B2 | 8/2006 | Ahn et al. | |
| 7,719,886 B2 | 5/2010 | Philipp et al. | |
| 8,053,364 B2 * | 11/2011 | French et al. | 438/674 |
| 8,351,241 B2 * | 1/2013 | Lu et al. | 365/148 |
| 8,420,478 B2 | 4/2013 | Chiang | |
| 2007/0187772 A1 | 8/2007 | Ahn | |
| 2007/0257257 A1 | 11/2007 | Cho et al. | |
| 2009/0237983 A1 | 9/2009 | Happ | |
| 2011/0227024 A1 | 9/2011 | Sekar | |

OTHER PUBLICATIONS

Lee et al.; Low Power Switching of Nonvolatile Resistive Memory Using Hafnium Oxide; Apr. 24, 2007; The Japan Society of Applied Physics; Japanese Journal of Applied Physics Apr. 24, 2007 pp. 21752179 vol. 46 No. 4B.
Lee et al.; Resistance Switching Behaviors of Hafnium Oxide Films Grown by MOCVD for Nonvolatile Memory Applications; Dec. 6, 2007; Pohang Institute of Science and Technology. Korea; Journal of the Electrochemical Society Dec. 6, 2007 pp. H92H96 vol. 155 2.
Smyth; The defect chemistry or metal oxides; Jan. 1, 2000; Z—Book-Author; Chapters 15 8 9 and 12 pp. 174 118161 and 217237.
Toriumi et al; Doped HfO2 for Higherk Dielectrics; Jan. 1, 2005; University of Tokyo; 208th ECS Meeting Abstract #508.
Chen, Y.S., et al.; Highly Scalable Hafnium Oxide Memory with Improvements of Resistive Distribution and Read Disturb Immunity; Jan. 1, 2009; Industrial Technology Research Institute; pp. IEDM09108.

(Continued)

*Primary Examiner* — Son Dinh
*Assistant Examiner* — Nam Nguyen

(57) ABSTRACT

Methods for producing RRAM resistive switching elements having optimal switching behavior include crystalline phase structural changes. Structural changes indicative of optimal switching behavior include hafnium oxide phases in an interfacial region between a resistive switching layer and an electrode.

20 Claims, 7 Drawing Sheets

(56) References Cited

OTHER PUBLICATIONS

Park, Jae-Wan., et al.; Influence of Oxygen Content on Electrical Properties of NiO Films Grown by Rf Reactive Sputtering for Resistive RandomAccess Memory Applications; Jan. 1, 2006; Academia—Hanyang University; Journal of Vacuum Science and Technology A. 23 5m oo 22052208.

Scott, D.M., et al.; Implanted Oxygen in NiSi Formation; Jan. 1, 1981; California Institute of Technology; Phys. State.Sol a 66 773778.

* cited by examiner

| Phase | Eg (eV) |
|---|---|
| Tetragonal | 5.45 |
| Orthorhombic | 5.60 |
| Monoclinic | 5.65 |
| Amorphous | 5.70 |
| Cotunnite | 6.10 |
| Cubic | 6.30 |

FIG. 2

METHOD FOR FORMING RESISTIVE SWITCHING MEMORY ELEMENTS WITH IMPROVED SWITCHING BEHAVIOR

FIELD OF THE INVENTION

The present invention relates generally to semiconductor memories and more particularly to a method for forming a resistive switching memory element with improved switching behavior.

BACKGROUND OF THE INVENTION

All but the simplest of electronic devices utilize nonvolatile memories. When an electronic device must retain information during and after being placed in an unpowered state, nonvolatile memories must be provided. Several types of nonvolatile memories are known in the art. Nonvolatile memories may be portable, auxiliary, or integrated in a circuit, or as a component, in both general and embedded computer systems. Most generally, nonvolatile memories are found in digital cameras, cellular telephones, music players, and as the key component in portable memory devices (e.g. USB based flash drives).

Nonvolatile memory is often formed using electrically-erasable programmable read only memory (EEPROM) technology. EEPROM, also known as flash memory, uses an architecture that is inadequate in its access, erase and write times, for the increasing operational speed requirements and decreasing size requirements of electronic devices. A memory architecture with faster access, erase and write times scalable to smaller devices is needed. Volatile memories (such as Random Access Memory (RAM)) are fast and inexpensive. Nonvolatile memories must improve before they can become a successful replacement in applications currently using volatile flash memories. Resistive switching memories are a type of nonvolatile memory which may provide an alternative to flash memories.

Resistive switching nonvolatile memories are formed of arrays of resistive switching memory with resistive switching elements where each element has two or more stable resistive states. Bi-stable resistive switching elements have two stable states. The application of an electric field having a particular voltage or current results in a desired element resistance. Voltage pulses are typically used to switch the memory element from one resistance state to the other.

Resistive switching elements use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form one or more conductive pathways in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage.

To function properly, a resistive switching element must have two well defined resistive states. Therefore, it would be advantageous if a method existed for determining predictable switching behavior in a resistive switching element.

BRIEF DESCRIPTION OF THE DRAWINGS

The numerous objects and advantages of the present invention may be better understood by those skilled in the art by reference to the accompanying figures in which:

FIG. 2 shows a tables of bandgap energies in a $HfO_2$ film for different crystal phases;

DETAILED DESCRIPTION

Figure 1:
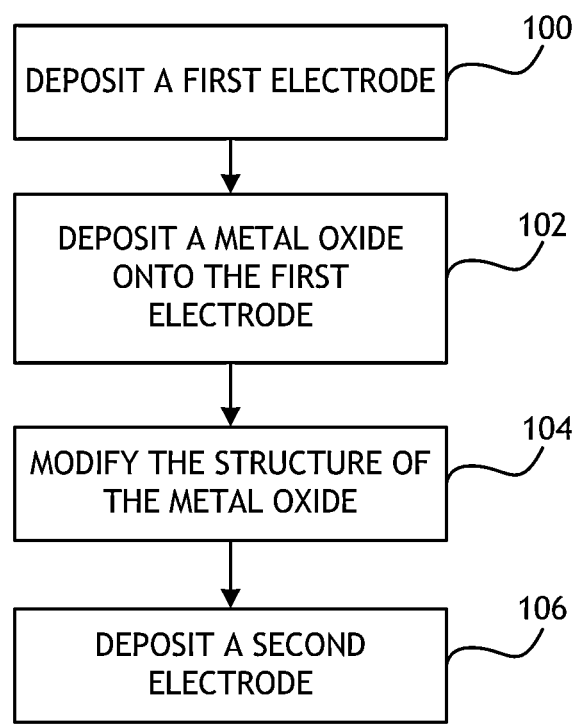
FIG. 1 shows a flowchart depicting one method for producing a resistive switching element with improved switching behavior by modifying the structure of a metal oxide.

The present invention relates to methods for producing and operating Resistive Random Access Memory (RRAM) resistive switching elements having predictable switching behavior. Embodiments of the present invention may determine predictable switching behavior in a resistive switching element by monitoring an interfacial region between the dielectric and an electrode for structural changes associated predictable switching behavior. Other embodiments of the present invention may include operating a RRAM with a resistive switching element configured to undergo structural changes when a switching voltage is applied.

Metal silicides indicate that the interfacial structure between the dielectric and the electrode has been converted from one crystal phase to another, including an amorphous phase. An amorphous interfacial layer between the dielectric and the electrode generally improves the switching behavior in resistive switching elements.

RRAM Cell Formation

A RRAM cell includes two electrodes with a resistive switching element, generally comprising a dielectric metal oxide, placed between the two electrodes. In RRAM, forming is a process by which the resistive switching element in the RRAM cell is put into its low resistance state for the first time. The process is performed by applying a voltage, called the forming voltage, across two electrodes of a resistive switching element to form one or more conductive pathways in the resistive switching element. Conductive pathways formed during the forming process reduce the resistance of the resistive switching element. Once the forming process is complete, a certain voltage, called the reset voltage, applied across the two electrodes will reset the conductive pathways, thereby increasing the resistance of the resistive switching element. Another voltage, called the set voltage, applied across the two electrodes will reform the conductive pathways, thereby reducing the resistance of the resistive switching element. A typical forming voltage for a RRAM resistive switching element is about seven volts while the set voltage and reset voltage are typically lower than the forming voltage.

A RRAM cell may be regarded as storing a logical bit; where the resistive switching element has increased resistance, the RRAM cell may be regarded as storing a "0" bit; where the resistive switching element has reduced resistance, the RRAM cell may be regarded as storing a "1" bit. Other circuitry, known in the art, reads the resistive state of the resistive switching element by applying a read voltage to the two electrodes and measuring the corresponding current through the resistive switching element. Where the current through the resistive switching element is greater than some predetermined baseline current, the resistive switching element must be in a reduced resistance state, and therefore the RRAM cell is storing a logical "1;" where the current through the resistive switching element is less than some predetermined baseline current, the resistive switching element must be in an increased resistance state, and therefore the RRAM cell is storing a logical "0." The read voltage is typically some predetermined voltage, less than the set voltage, the reset voltage and the forming voltage. The read voltage must be sufficient to determine the resistive state of the resistive switching element, but must not alter the conductive pathways of the resistive switching element.

Forming voltage, set voltage, reset voltage and read voltage, and the increased resistive state and reduced resistive state, are all functions of the electrodes used in the resistive switching element, a type of resistive switching material used in the resistive switching element, and the processes performed on those electrodes and resistive switching material such as doping and annealing. Manufacturers desire RRAM with discrete, well defined increased and reduced resistive states, and reduced forming voltage.

Modifying the Metal Oxide to Produce Structural Changes as in FIG. 1

Referring to FIG. 1, a method for producing a RRAM cell with improved switching behavior is shown. A first electrode may be deposited 100 onto a substrate. The first electrode is a material suitable for use in a RRAM cell, such as polycrystalline silicon (poly-Si). A metal oxide resistive switching element may then be deposited 102 onto the first electrode by atomic layer deposition (ALD), chemical vapor deposition (CVD), physical vapor deposition (PVD) or some equivalent process to form a stack. The metal oxide may be a dielectric suitable for use in a resistive switching element such as hafnium oxide or $HfO_x$. The metal oxide may then be modified 104 by the application of thermal treatment and or an electrical field. The physical structure of the metal oxide is modified to form regions in the metal oxide, near the first electrode, indicative of optimal resistive switching behavior. Regions indicative of optimal resistive switching behavior include an interfacial layer between the metal oxide and the electrode containing different phases of hafnium oxide ($HfO_2$). A second electrode may then be deposited 106 onto the stack. The second electrode is a material suitable for use in a RRAM cell such as titanium nitride or TiN.

Different phases of $HfO_2$ may be formed in a local region upon thermal treatment or when an electrical field is applied to the structure, causing the hafnium oxide structural transformation and transitions from a first phase to another crystal phase. The different phases may include an amorphous or a crystalline phase. Different crystal phases may have different bandgaps and barrier heights; for example, referring to FIG. 2, a tetragonal crystal phase of $HfO_2$ may have a bandgap of 5.45 eV, an orthorhombic crystal phase may have a bandgap of 5.60 eV, a monoclinic crystal phase may have a bandgap of 5.65 eV, a cotunnite crystal phase may have a bandgap of 6.10 eV, a cubic crystal phase may have a bandgap of 6.30 eV and an amorphous crystal phase may have a bandgap of 5.70 eV. Varying crystal phases in a metal oxide indicate bistable states, useful in RRAM. When the metal oxide is in an amorphous phase near the first electrode, the resistive switching element is in a low resistance state.

Alternatively, the metal oxide may be modified by converting $Hf_4O_8$ to other oxides of hafnium such as $Hf_4O_7$. Such compositional change may result in oxygen vacancies. Oxygen vacancies in a metal oxide may modulate current and thereby enhance the switching behavior of the metal oxide in a RRAM cell. Converting $Hf_4O_8$ to other oxides of hafnium such as $Hf_4O_7$ may be accomplished by annealing the metal oxide or by doping the metal oxide.

Figure 3:
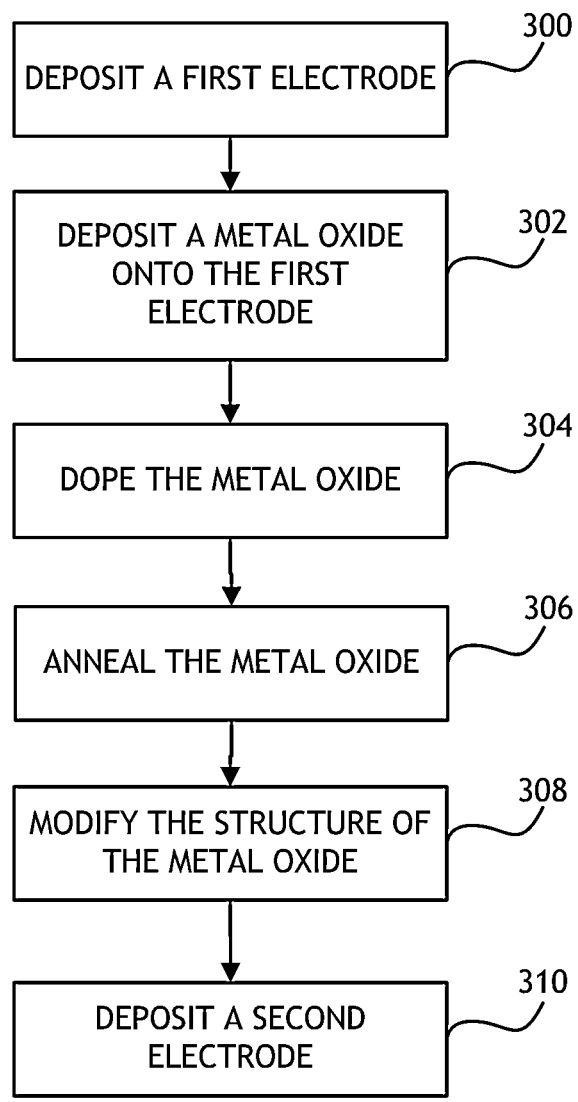
FIG. 3 shows a flowchart depicting another method for producing a resistive switching element with improved switching behavior by doping a metal oxide.

Doping and Annealing the Metal Oxide as in FIG. 3

Referring to FIG. 3, another method for producing a RRAM cell with improved switching behavior is shown. A first electrode may be deposited 300 onto a substrate. The first electrode is a material suitable for use in a RRAM cell, such as poly-Si. A metal oxide resistive switching element may then be deposited 302 onto the first electrode by ALD, CVD, PVD or some equivalent process. The metal oxide may be a dielectric suitable for use as an insulator in a resistive switching element such as hafnium oxide or $HfO_x$. The metal oxide may then be doped 304 with a dopant to add oxygen vacancies to the metal oxide. Oxygen vacancies are a specific type of anomaly in the structure of a dielectric material that enhances the ability of the dielectric material to form conductive pathways. The dopant may be a material such as aluminum (Al), titanium (Ti) or zirconium (Zr). The metal oxide may be annealed 306 to encourage the formation of oxygen vacancies. The metal oxide may then be modified 308 by the application of an electrical field. The physical structure of the metal oxide is modified to form regions in the metal oxide, near the first electrode, indicative of optimal resistive switching behavior. Regions indicative of optimal resistive switching behavior include a local region of transitioning crystalline phases such as from tetragonal to orthorhombic. Transitioning crystallinity may also include transitioning from a crystalline phase to an amorphous phase. Alternatively, the metal oxide may be modified by converting $Hf_4O_8$ to other oxides of hafnium such as $Hf_4O_7$. Conversion of $Hf_4O_8$ to other oxides of hafnium such as $Hf_4O_7$ adds oxygen vacancies to the resulting metal oxide that promote the formation of conductive pathways. A second electrode may then be deposited 310 onto the stack. The second electrode is a material suitable for use in a RRAM cell such as titanium nitride (TiN).

Figure 5:
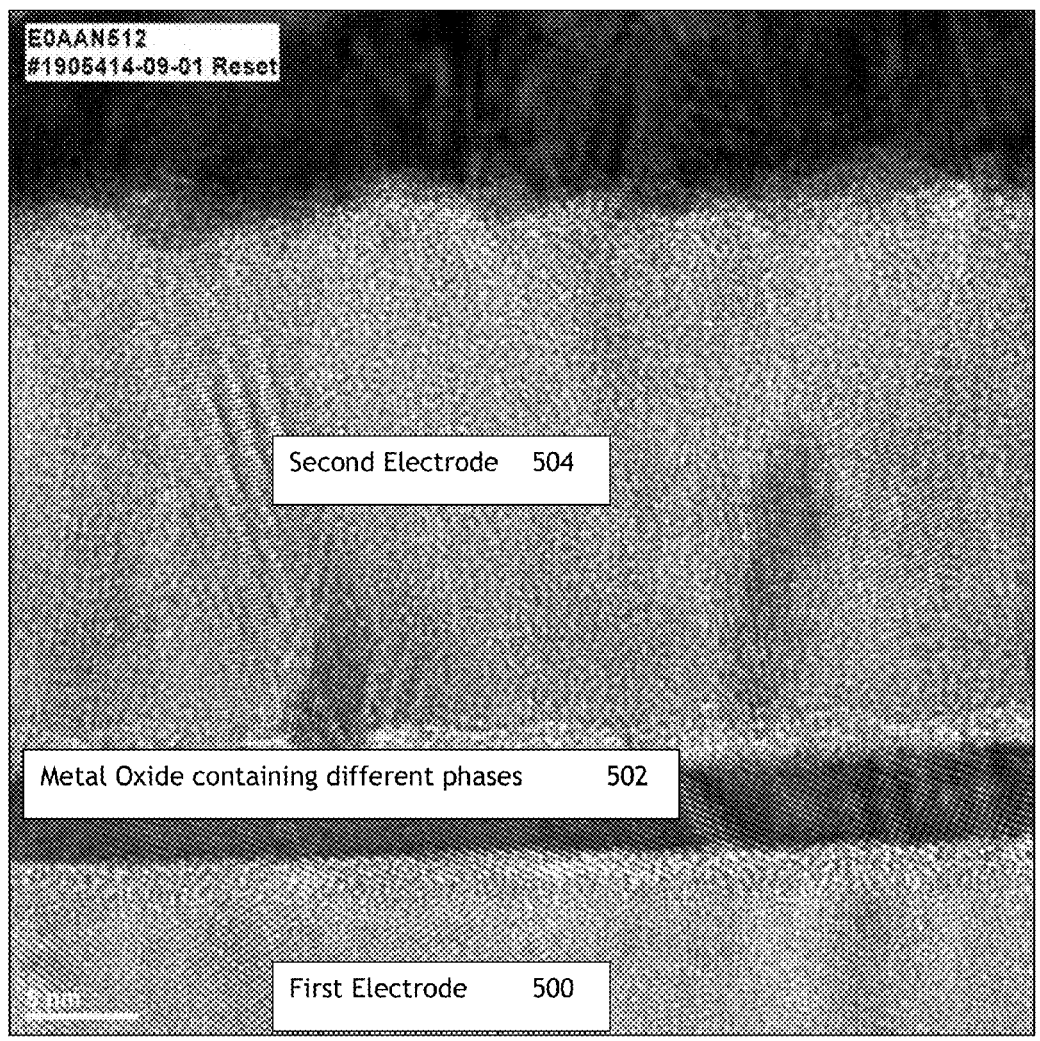
FIG. 5 shows a cross-section of a resistive switching element taken with a transmission electron microscope.

The structural changes described can be local or homogenous in the metal oxide with respect to the first or second electrode, or both, or with respect to other metal oxide layers in the RRAM cell. FIG. 5 shows a cross-section of a RRAM cell using transmission electron microscopy. A RRAM cell produced according to the present invention may have a first electrode 500, a resistive switching element 502 comprising one or more layers of a metal oxide, and a second electrode 504. The resistive switching element 502 may be configured to undergo structural changes in response to the application of a switching voltage. For example, a resistive switching element 502 comprised of one or more layers of metal oxide film may undergo a crystalline conversion whereby the crystalline structure of at least one of the metal oxide films is converted form an amorphous film to a crystalline film, or from a crystalline film to an amorphous film. Alternatively, at least one of the metal oxide films comprising hafnium may undergo conversion from $Hf_4O_8$ to different oxides of hafnium. Configuring the resistive switching element 502 to undergo structural changes may be accomplished by doping one of the one or more metal oxide films with a dopant such as aluminum, titanium or zirconium. Configuring the resistive switching element 502 to undergo structural changes may also be accomplished by annealing the resistive switching element 502. Such structural changes may occur in a region near either the first electrode or the second electrode, and may enhance the formation of conductive pathways in the metal oxide. Optimal switching behavior may depend on the manufacture's desired forming, set or reset voltages.

Figure 4:
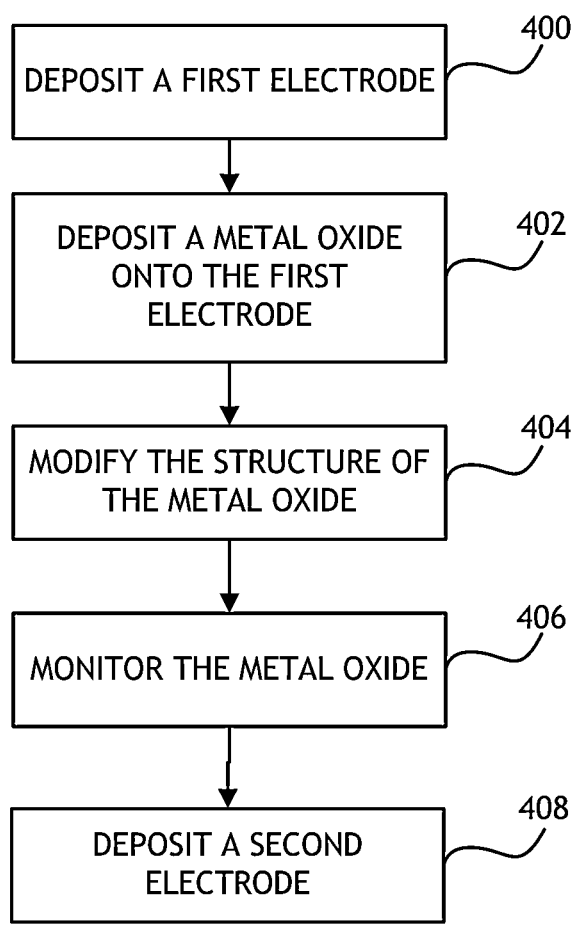
FIG. 4 shows a flowchart depicting another method for producing a resistive switching element with improved switching behavior by monitoring the structure of a metal oxide.

Monitoring the Metal Oxide as in FIG. 4

Referring to FIG. 4, another method for producing a RRAM cell with improved switching behavior is shown. A first electrode may be deposited 400 onto a substrate. The first electrode is a material suitable for use in a RRAM cell, such as poly-Si. A metal oxide resistive switching element may then be deposited 402 onto the first electrode by ALD, CVD, PVD or some equivalent process. The metal oxide may be a dielectric suitable for use as an insulator in a resistive switching element such as hafnium oxide or $HfO_x$. The metal oxide may then be modified 404 by the application of an electrical field. The metal oxide may be modified to form regions in the metal oxide, near the first electrode, indicative of optimal resistive switching behavior. Alternatively, the resistive switching element may include several metal oxide layers; in which case a first metal oxide layer may be modified to form regions in the first metal oxide, near a second metal oxide, indicative of optimal resistive switching behavior. Regions indicative of optimal resistive switching behavior include an interfacial layer between the metal oxide and the electrode a local region of transitioning crystalline phases such as from tetragonal to orthorhombic. Transitioning crystallinity may also include transitioning from a crystalline phase to an amorphous phase. Alternatively, the metal oxide may be modified by converting $Hf_4O_8$ to other oxides of hafnium such as $Hf_4O_7$. Regions of the metal oxide near the first electrode, or near a second metal oxide, may be monitored 406 for structures indicative of optimal resistive switching behavior. Monitoring the metal oxide may be accomplished by x-ray spectroscopy, transmission electron microscopy or some other equivalent process. A second electrode may then be deposited 408 onto the stack. The second electrode is a material suitable for use in a RRAM cell such as titanium nitride (TiN).

Figure 6:
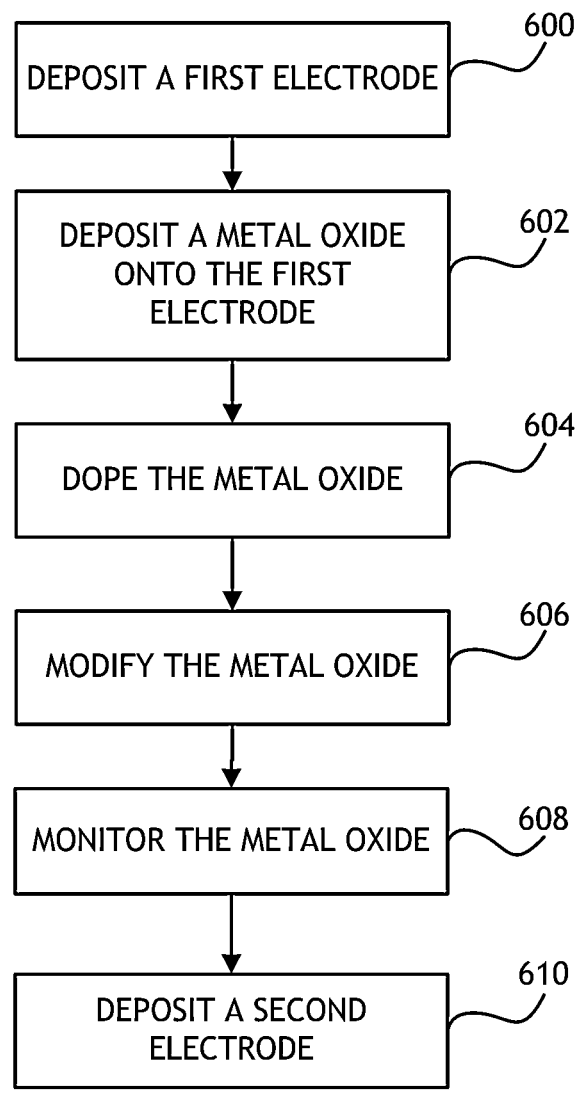
FIG. 6 shows a flowchart depicting another method for producing a resistive switching element with improved switching behavior by doping and monitoring the structure of a metal oxide.

Monitoring the Doped Metal Oxide as in FIG. 6

Referring to FIG. 6, another method for producing a resistive switching element with improved switching behavior is shown. A first electrode may be deposited 600 onto a substrate. The first electrode is a material suitable for use in a resistive switching element, such as poly-Si. A metal oxide may then be deposited 602 onto the first electrode by ALD, CVD, PVD or some equivalent process to form a stack. The metal oxide may be a dielectric suitable for use as an insulator in a resistive switching element such as hafnium oxide or $HfO_x$. The metal oxide may then be doped 604 with a dopant to add oxygen vacancies to the metal oxide. Oxygen vacancies are a specific type of anomaly in the structure of a dielectric material that enhances the ability of the dielectric material to form conductive pathways. The dopant may be a material such as Al, Ti or Zr. The metal oxide may then be modified 606 by the application of an electrical field. The metal oxide may be modified to form regions in the metal oxide, near the first electrode, indicative of optimal resistive switching behavior. Alternatively, the resistive switching element may include several metal oxide layers; in which case a first metal oxide layer may be modified to form regions in the first metal oxide, near a second metal oxide, indicative of optimal resistive switching behavior. Regions indicative of optimal resistive switching behavior include an interfacial layer between the metal oxide and the electrode a local region of transitioning crystalline phases such as from tetragonal to orthorhombic. Transitioning crystallinity may also include transitioning from a crystalline phase to an amorphous phase. Alternatively, the metal oxide may be modified by converting $Hf_4O_8$ to other oxides of hafnium such as $Hf_4O_7$. Regions of the metal oxide near the first electrode, or near a second metal oxide, may be monitored 608 for structures indicative of optimal resistive switching behavior. A second electrode may then be deposited 610 onto the stack. The second electrode is a material suitable for use in RRAM cell such as titanium nitride (TiN).

Figure 7:
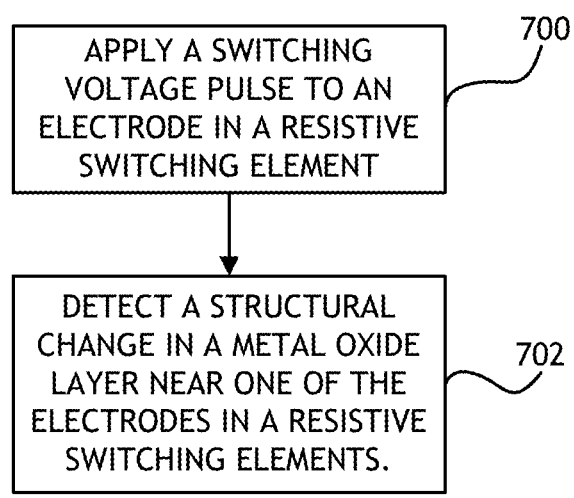
FIG. 7 shows a flowchart depicting a method for operating a resistive switching element having a metal oxide configured to undergo structural changes when a switching voltage is applied.

Operating a RRAM as in FIG. 7

Referring to FIG. 7, one embodiment of a method for operating a RRAM cell is shown. In a RRAM cell, such as in FIG. 5, having a first electrode 500, a metal oxide resistive switching element 502 and a second electrode 504, the RRAM cell may be operated by applying 700 a switching voltage to one of either the first electrode 500 or the second electrode 504, and then detecting 702 a structural change in the metal oxide resistive switching element 502, in at least one of a region near the first electrode 500 and a region near the second electrode 504, in response to the switching voltage pulse. Such structural change may be a change in the crystalline structure of the metal oxide from a first crystal phase to a second crystal phase. A change in the crystalline structure may include a change to or from an amorphous crystalline phase.

Where the metal oxide is comprised of hafnium, the structural change may be the formation of hafnium silicide masses. Alternatively, a metal oxide comprised of $Hf_4O_8$ may undergo conversion to different metal oxides such as $Hf_4O_7$.

The resistive switching element may be configured to undergo such structural changes by doping the metal oxide with a dopant such as aluminum, titanium or zirconium. The resistive switching element may also be configured to undergo such structural changes by annealing.

It is believed that the present invention and many of its attendant advantages will be understood by the forgoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following Claims to encompass and include such changes.

The invention claimed is:

1. A method of operating a resistive-switching memory cell, the method comprising:
   providing the resistive-switching memory cell, wherein the cell comprises a first metal oxide layer between a first electrode and a second electrode;
   applying an electrical field to the first metal oxide layer by applying a switching voltage between the first electrode and the second electrode;

wherein the electrical field changes a resistance state of the resistive-switching memory cell by changing at least one structural property of a region of the first metal oxide layer; and wherein the at least one structural property comprises at least one of crystallinity, crystal phase, silicide content, or molecular structure.

2. The method of claim 1, wherein the changing of the at least one structural property comprises transitioning a portion of the metal oxide in the region from crystalline to amorphous or from amorphous to crystalline.

3. The method of claim 1, wherein the region is near the first electrode, and wherein the metal oxide in the region is amorphous when the resistive-switching memory cell is in a low resistance state.

4. The method of claim 1, wherein the changing of the at least one structural property comprises transitioning a portion of the metal oxide in the region from a crystal phase having a first bandgap to a crystal phase having a second bandgap; wherein the first bandgap differs from the second bandgap.

5. The method of claim 1, wherein the changing of the at least one structural property comprises transitioning a portion of the metal oxide in the region from one of a tetragonal, orthorhombic, monoclinic, cotunnite, or cubic crystal phase to a different one of the tetragonal, orthorhombic, monoclinic, cotunnite, or cubic crystal phase.

6. The method of claim 1, wherein the changing of the at least one structural property comprises formation or dissociation of a silicide mass.

7. The method of claim 1, wherein the changing of the at least one structural property comprises an increase or decrease of hafnium silicide content.

8. The method of claim 1, wherein the changing of the at least one structural property comprises changing a portion of the metal oxide in the region to a differently structured oxide of a same metal.

9. The method of claim 1, wherein the changing of the at least one structural property comprises converting $Hf_4O_8$ to $Hf_4O_7$ or $Hf_4O_7$ to $Hf_4O_8$.

10. The method of claim 1, wherein the switching voltage is less than or equal to 7V.

11. The method of claim 1, wherein the region comprises the entirety of the first metal oxide layer, and wherein the changing of the at least one structural property is substantially homogeneous.

12. The method of claim 1, wherein the changing of the at least one structural property occurs in a first region of the first metal oxide layer but not in a second region of the first metal oxide layer;

wherein the first region comprises a top or bottom interface between the first metal oxide layer and a neighboring layer; and wherein the second region comprises a center plane of the first metal oxide layer parallel to, but not coincident with, the top or bottom interface of the first metal oxide layer.

13. The method of claim 12, wherein the neighboring layer is one of the first electrode or the second electrode.

14. The method of claim 12, wherein the neighboring layer is a second metal oxide layer.

15. The method of claim 12, wherein the neighboring layer contains silicon, and wherein the at least one structural property comprises silicide content.

16. The method of claim 12, wherein the neighboring layer is a polysilicon electrode, and wherein the at least one structural property comprises silicide content.

17. The method of claim 1, wherein the first metal oxide layer comprises both crystalline and amorphous material.

18. The method of claim 1, wherein the first metal oxide layer comprises two or more different crystal phases.

19. The method of claim 1, wherein the first metal oxide layer comprises a silicide of a same metal as the metal oxide.

20. The method of claim 1, wherein the first metal oxide layer comprises at least two different molecular structures of the metal oxide.

* * * * *

UNITED STATES PATENT AND TRADEMARK OFFICE
CERTIFICATE OF CORRECTION

PATENT NO. : 8,787,066 B2  Page 1 of 1
APPLICATION NO. : 13/281777
DATED : July 22, 2014
INVENTOR(S) : Yun Wang et al.

It is certified that error appears in the above-identified patent and that said Letters Patent is hereby corrected as shown below:

On the title page item (75): Insert --Tim Minvielle, San Jose, CA (US); Takeshi Yamaguchi, Kanagawa, (JP)--

Signed and Sealed this
Twelfth Day of April, 2016

Michelle K. Lee
*Director of the United States Patent and Trademark Office*